(12) United States Patent  (10) Patent No.: US 8,947,050 B2
Gale et al.  (45) Date of Patent: Feb. 3, 2015

(54) CHARGING OF VEHICLE BATTERY BASED ON INDICATORS OF IMPEDANCE AND HEALTH

(75) Inventors: Allan Roy Gale, Livonia, MI (US); Bruce Carvell Blakemore, Plymouth, MI (US); Paul Theodore Momcilovich, Carleton, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 358 days.

(21) Appl. No.: 12/721,607

(22) Filed: Mar. 11, 2010

(65) Prior Publication Data

US 2011/0163722 A1 Jul. 7, 2011

(51) Int. Cl.
*H02J 7/00* (2006.01)
*B60L 11/18* (2006.01)
*H02J 7/04* (2006.01)
*G01R 31/36* (2006.01)

(52) U.S. Cl.
CPC ........... *B60L 11/1857* (2013.01); *H02J 7/0077* (2013.01); *H02J 7/041* (2013.01); *H02J 7/045* (2013.01); *G01R 31/3679* (2013.01); *Y02T 10/7005* (2013.01); *Y02T 10/705* (2013.01)
USPC ............................ 320/134; 320/137; 320/132

(58) Field of Classification Search
USPC ........................................................ 320/134
See application file for complete search history.

(56) References Cited

U.S. PATENT DOCUMENTS

| 3,857,087 | A | | 12/1974 | Jones |
| 4,745,349 | A | | 5/1988 | Palanisamy et al. |
| 5,193,067 | A | * | 3/1993 | Sato et al. ........................ 702/63 |
| 5,196,780 | A | * | 3/1993 | Pacholok ....................... 320/148 |
| 5,281,919 | A | * | 1/1994 | Palanisamy ................... 324/427 |
| 5,757,192 | A | | 5/1998 | McShane et al. |
| 6,057,671 | A | | 5/2000 | Kuno |
| 6,211,681 | B1 | | 4/2001 | Kagawa et al. |
| 6,262,577 | B1 | | 7/2001 | Nakao et al. |
| 6,424,157 | B1 | | 7/2002 | Gollomp et al. |
| 6,476,585 | B1 | * | 11/2002 | Simmonds ..................... 320/162 |
| 6,788,069 | B2 | | 9/2004 | Vacher |
| 6,983,212 | B2 | | 1/2006 | Burns |
| 7,269,535 | B2 | | 9/2007 | Kishimoto |
| 7,317,299 | B2 | | 1/2008 | Koo |
| 7,545,109 | B2 | | 6/2009 | Salman et al. |

(Continued)

FOREIGN PATENT DOCUMENTS

EP 1180692 A1 2/2002
JP 2000190793 A 7/2000

(Continued)

OTHER PUBLICATIONS

Y. Konya, et al., A Deterioration Estimating System for 200-Ah Sealed Lead-Acid Batteries, downloaded on Mar. 25, 2009 from IEEE Explore.

(Continued)

*Primary Examiner* — Arun Williams
(74) *Attorney, Agent, or Firm* — David B. Kelley; Brooks Kushman P.C.

(57) ABSTRACT

A method for charging a battery may include determining a degradation condition of the battery based on impedance parameters of the battery, altering a default charge profile for the battery based on the degradation condition, and charging the battery with the altered charge profile.

9 Claims, 3 Drawing Sheets

(56) References Cited

U.S. PATENT DOCUMENTS

| | | |
|---|---|---|
| 7,880,597 B2 | 2/2011 | Uchida |
| 2006/0113959 A1 | 6/2006 | Honma |
| 2006/0132096 A1* | 6/2006 | Maleus .................... 320/141 |
| 2006/0152168 A1* | 7/2006 | O'Gorman et al. ....... 315/209 R |
| 2007/0080006 A1 | 4/2007 | Yamaguchi |
| 2007/0159177 A1 | 7/2007 | Bertness et al. |
| 2007/0236225 A1 | 10/2007 | Tsenter et al. |
| 2008/0150457 A1 | 6/2008 | Salman et al. |
| 2008/0231284 A1 | 9/2008 | Birke et al. |
| 2008/0238361 A1* | 10/2008 | Pinnell et al. ................ 320/107 |
| 2009/0040033 A1 | 2/2009 | Uchida |
| 2009/0207664 A1* | 8/2009 | Kim et al. ................ 365/185.19 |
| 2010/0327818 A1* | 12/2010 | Taniguchi et al. ............ 320/162 |

FOREIGN PATENT DOCUMENTS

| | | |
|---|---|---|
| WO | 9201502 A1 | 2/1992 |
| WO | 9215022 A1 | 9/1992 |
| WO | 2007055101 A1 | 5/2007 |

OTHER PUBLICATIONS

M.S. Duvall, Battery Evaluation for plug-in hybrid electric vehicles, printed from IEEE Explore on Oct. 13, 2008.

Electric Transportation Applications, EV America: Hybrid Electric Behicle (HEV) Technical Specifications, effective Nov. 1, 2004.

* cited by examiner

CHARGING OF VEHICLE BATTERY BASED ON INDICATORS OF IMPEDANCE AND HEALTH

BACKGROUND

Plug-in hybrid electric vehicles may include a high voltage traction battery and a low voltage auxiliary battery. Each of the batteries may be charged with energy from an electrical grid.

SUMMARY

A condition of a battery may be determined based on impedance parameters of the battery. A default charge profile for the battery may be altered based on the condition. The battery may be charged with the altered charge profile.

While example embodiments in accordance with the invention are illustrated and disclosed, such disclosure should not be construed to limit the invention. It is anticipated that various modifications and alternative designs may be made without departing from the scope of the invention.

DETAILED DESCRIPTION

Figure 1:
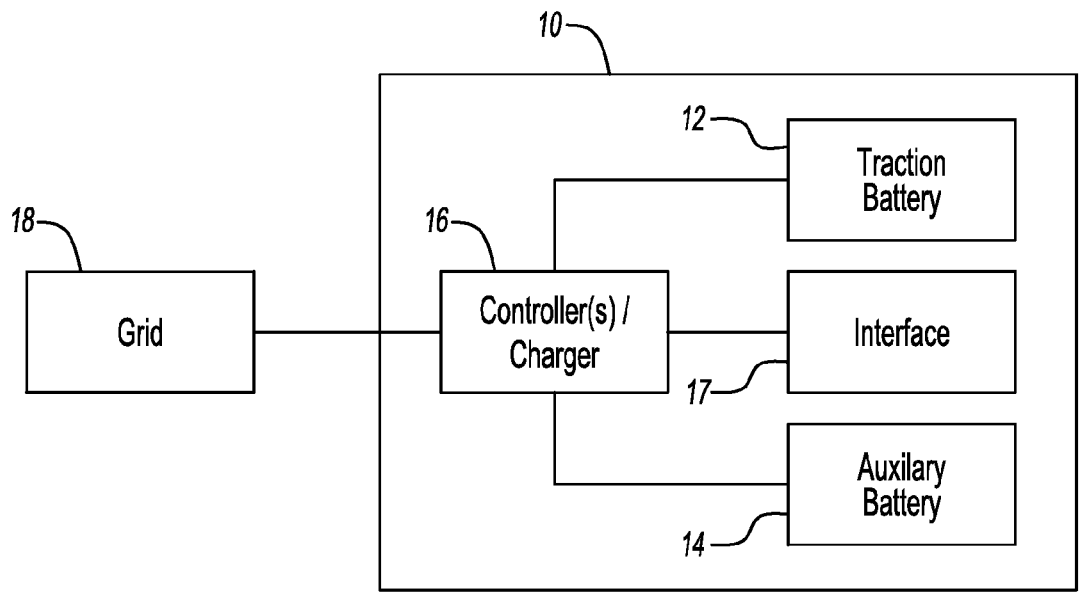
FIG. 1 is a block diagram of an embodiment of an alternatively powered vehicle.

Referring to FIG. 1, a vehicle 10 may include a traction battery 12, low voltage auxiliary battery 14, control module(s) and/or battery charger 16, and driver interface 17 (e.g., display screen/panel, speaker system, etc.) As known in the art, the traction battery 12 may be arranged to provide energy to move the vehicle 10; the auxiliary battery 14 may be arranged to provide energy to auxiliary loads such as lighting, etc.

The vehicle 10, in the embodiment of FIG. 1, is a plug-in hybrid electric vehicle (PHEV). (Other vehicle configurations such as battery electric, etc., however, are also contemplated.) The controller/charger 16, therefore, may be electrically connected with a power grid 18 (e.g., it may be plugged-in to a wall outlet) and permit energy to flow from the grid 18 to either of the batteries 12, 14 to charge the batteries 12, 14.

An auxiliary battery may be charged to a fixed voltage or a voltage that is a function of ambient temperature. If an auxiliary battery contains a cell with relatively low capacity (due to aging) or a cell that is shorted, an attempt to charge the battery to a fixed voltage may result in an overcharge condition of the low capacity cell or an overcharge condition of non-shorted cells. Overcharging can result in cell heating and release of hydrogen (gassing), which may adversely affect the auxiliary battery.

In a vehicle powered by an internal combustion engine, cell heating and/or gassing may be of little concern as the auxiliary battery is charged during driving. The effects of cell heating and/or gassing may be mitigated by the airflow experienced during driving. Additionally, because the auxiliary battery provides energy to start the engine, a weak or shorted cell is likely to result in poor or no engine starting. The auxiliary battery will likely be replaced before the heating or gassing condition occurs.

In alternatively powered vehicles, such as the PHEV 10, the auxiliary battery 14 does not provide starting energy. It may thus continue to be operated with a weak or shorted cell. Also, the power line from the grid 18 may have a limited amount of power it can provide to the controller/charger 16. Excessive charging of the auxiliary battery 14 can increase the amount of time (and cost) it takes to complete a vehicle charge.

An auxiliary battery may be found to be "good" or "bad" by connecting a relatively small resistance (e.g., 50 m$\Omega$) across its terminals to draw a rather large load current. Under these circumstances, the voltage of a "good" 12 V battery, for example, may drop to 9 V while the voltage of a "bad" 12 V battery may drop to 4 V. This technique, however, cannot be performed during battery charge and may not reveal why the battery is "bad."

Certain embodiments disclosed herein may assess a condition of the auxiliary battery 14 during charge, select a charge voltage and maximum current based on the condition, select a set point voltage and current based on the condition, and/or notify a vehicle operator of the condition and/or selections. The age and/or state of plate deterioration, for example, may be assessed based on the behavior of cell voltages when the auxiliary battery 14 is exposed to certain charge profiles. Once the condition of the auxiliary battery 14 is determined, the charge and operating profiles may be tailored to the specific conditions detected. A driver may also be informed, via the interface 17, as to the condition of the auxiliary battery 14 (e.g., age), the capability of the auxiliary battery 14 to hold charge, whether the auxiliary battery 14 has a bad cell, whether a modified charge profile has been implemented, whether a new battery is needed, etc. Other scenarios are also possible.

Figure 2:
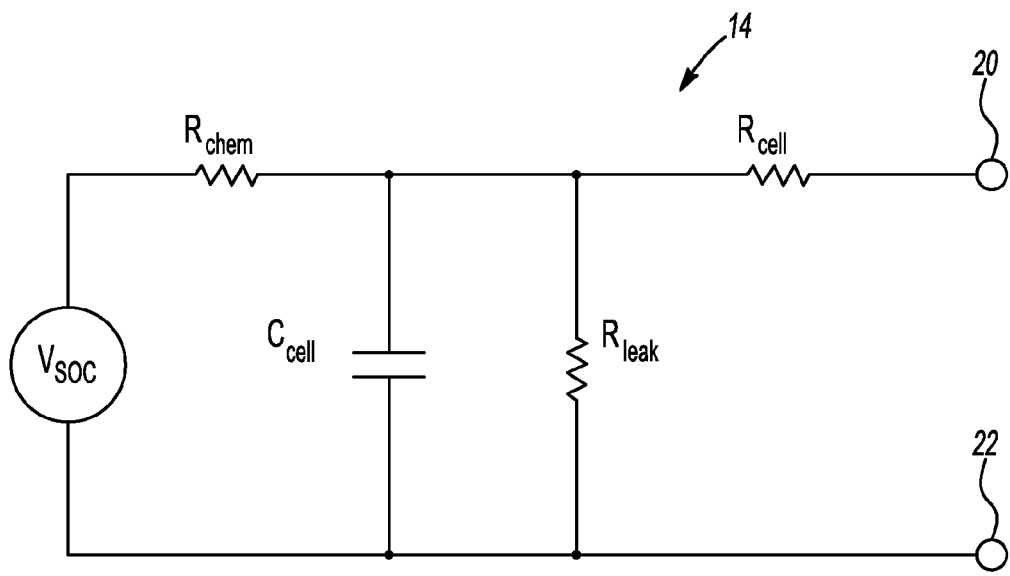
FIG. 2 is a schematic diagram of an equivalent circuit representing cells of the auxiliary battery of FIG. 1.

Referring to FIGS. 1 and 2, an equivalent circuit representation of the auxiliary battery 14 includes a state of charge (SOC) dependent voltage source, $V_{SOC}$, a cell capacitance, $C_{cell}$, incorporating both electrical and active material activation energy requirements, a chemical process resistance, $R_{chem}$, a cell resistance, $R_{cell}$, a leakage resistance, $R_{leak}$, and terminals 20, 22. Pulses of generally constant current from the controller/charger 16, $i_{chg}$, may be applied to the terminals 20, 22.

When the controller/charger 16 applies $i_{chg}$ to the terminals 20, 22, $C_{cell}$ will begin to acquire charge (until the activation energy component of $C_{cell}$ is met, however, little energy will flow through $R_{chem}$ and $R_{leak}$). Its voltage will thus change according to the equation $$v_{SOC}(t) = \frac{1}{C_{cell}} \int \left( i_{chg} - \frac{V_{SOC}}{R_{leak}} \right) dt + i_{chg} * R_{cell} + V_{SOC}(0) \qquad (1)$$

When $C_{cell}$ is charged, energy will flow through $R_{chem}$ for storage in $V_{SOC}$. The change in $V_{SOC}$ during charge is proportional to the ratio of added energy stored in the auxiliary battery 14 to its total energy storage capability. In addition, the change in $V_{SOC}$ is small compared to the total value of $V_{SOC}$, resulting in the change in $V_{SOC}$ being a linear representation of A-hrs stored during the charge. The equation for $v_{SOC}(t)$ during this storage phase is $$v_{SOC}(t) = i_{chg} * (R_{cell} + R_{chem}) + V_{SOC}(0) \qquad (2)$$

When the charge is stopped, $i_{chg}=0$ and $C_{cell}$ will discharge into $V_{SOC}$ through $R_{chem}$ according to the equation $$v_{SOC}(t) = \frac{1}{C_{cell}} \int i_{cell} dt = i_{cell} * R_{chem} + V_{SOC} \quad (3)$$

where $i_{cell}$ is the current associated with $C_{cell}$.

The controller/charger 16 (or other suitable controller) may monitor the above described change in voltage. As explained below, this change in voltage along with other parameters may be used to assess the condition of the auxiliary battery 14.

Figure 3:
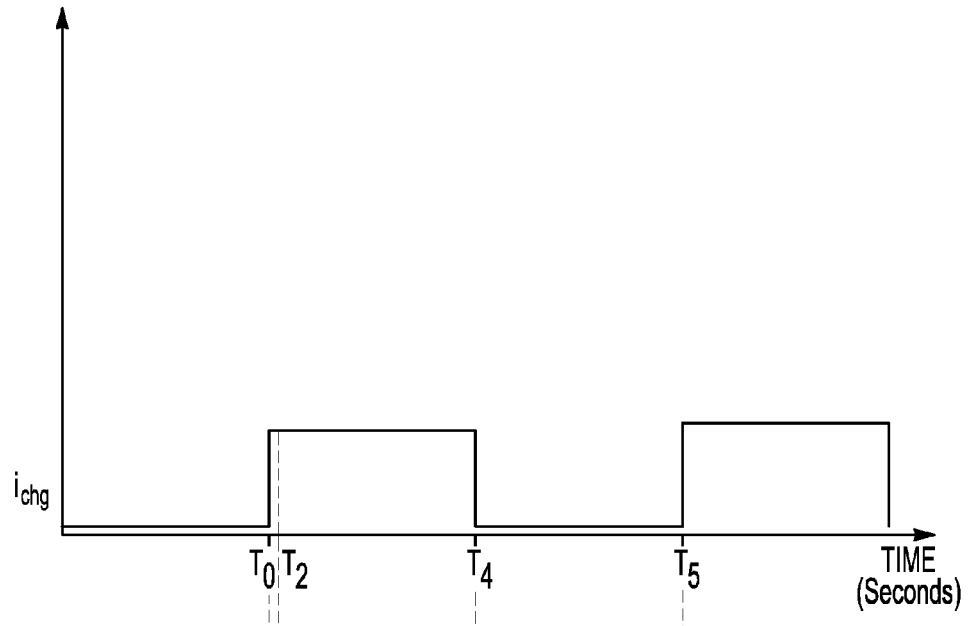
FIG. 3 is an example plot of charge current versus time.

Referring to FIGS. 1 and 3, the controller/charger 16 may apply one or more current pulses to the auxiliary battery 14 using known techniques, such as those described in U.S. Pat. No. 3,857,087 to Jones. For example, the duration of the pulses of FIG. 3 are sufficiently long (e.g., 30 sec.) such that $C_{cell}$ is able to charge and a small amount of energy is transferred into $V_{SOC}$. Each pulse is followed by a rest period sufficiently long (e.g., 30 sec.) such that $C_{cell}$ is able to discharge to the value of $V_{SOC}$. Other suitable profiles, however, may be used.

Figure 4:
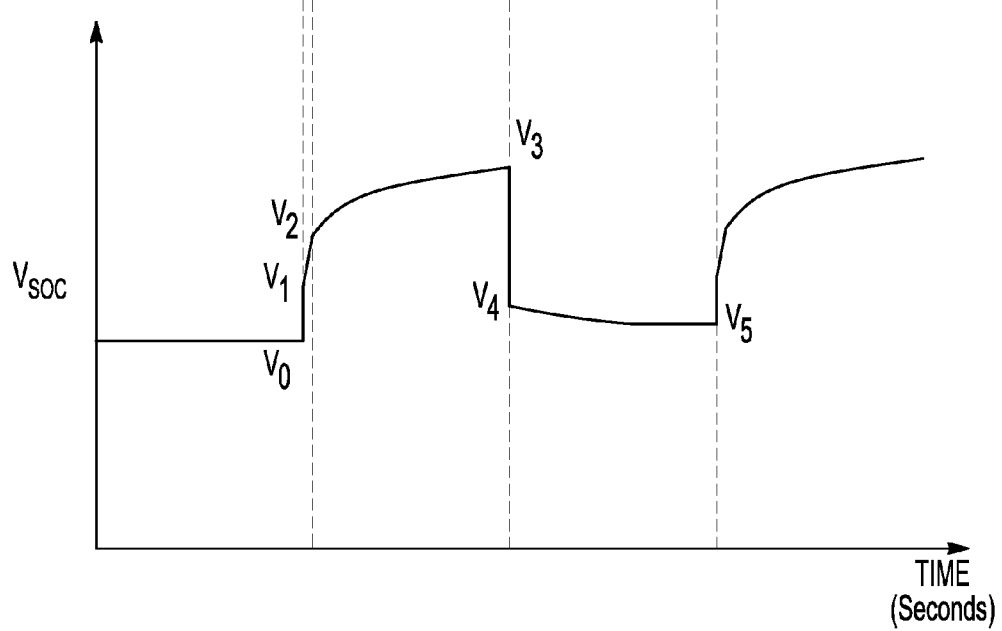
FIG. 4 is an example plot of cell voltage versus time.

Referring to FIGS. 3 and 4, the cell voltage, $v_{SOC}(t)$, changes according to (1), (2) and (3) as the current pulses are applied and removed. Several voltages of interest, $V_0, V_1, V_2, V_3, V_4, V_5$, are labeled. These voltages along with the charge current magnitude and duration may be used to determine the following impedance parameters:

$$R_{cell} = \frac{(V_1 - V_0)}{i_{chg}} \quad (4)$$

$$R_{chem} = \left(\frac{(V_3 - V_4)}{i_{chg@V_3}}\right) - R_{cell} \quad (5)$$

$C_{cell}$ can be determined from $R_{chem}$ and the rate of decay in voltage from $V_4$ to $V_5$. During this interval, (3) can be rewritten as $$V_{SOC} = (V_4 - V_5) * e^{-t/RC} + V_5 \quad (6)$$

or, $$C_{cell} = \frac{-t}{R_{chem} * \ln\left(\frac{V_{SOC} - V_5}{V_4 - V_5}\right)} \quad (7)$$

(Of course, $C_{cell}$ may also be calculated based on $V_1$ and $V_2$.) These impedance parameters change with the condition of the auxiliary battery 14 of FIG. 1 and may be used to determine how the auxiliary battery 14 should be charged as well as when it should be replaced.

A typical battery is rated in A-hrs for a charge/discharge cell voltage range. That is, $$A\text{-hrs} = \int i_{chg} dt \quad (8)$$

The difference in A-hrs during a cell charge compared with a cell discharge is due to the electrical and electro-chemical parameters of the cell and will result in less A-hrs during discharge of a fixed A-hr charge due to the cell energy loss via $R_{cell}$ and $R_{chem}$. The ratio of A-hrs out to A-hrs in may be given by $$\text{Health\_Term\_1} = \frac{I_{chg} * \text{time}}{\frac{dV_{SOC}}{dt}} = \frac{I_{chg} * \text{time}_{(V_4-V_0)}}{V_5 - V_0} \quad (9)$$

The total A-hrs stored by the battery 14 may be given by $$\text{Health\_Term\_2} = \frac{A - \text{hrs}}{(V_5 - V_0) * K} \quad (10)$$

where K is a constant that may be determined via testing, etc.

Figure 5:
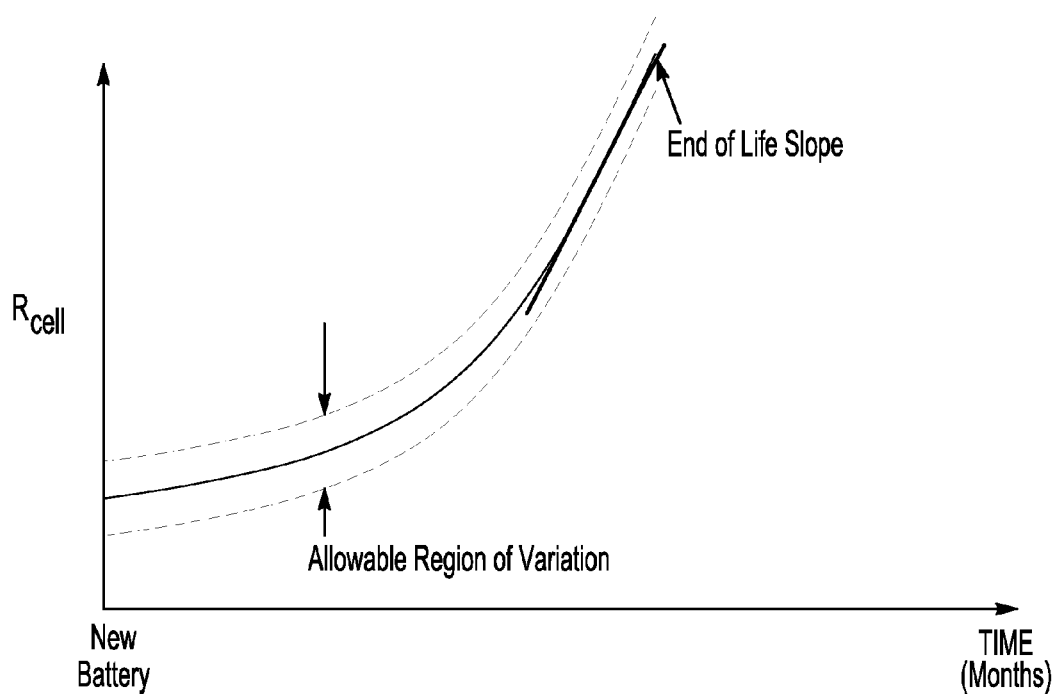
FIG. 5 is an example plot of cell resistance versus time.

Referring to FIGS. 1 and 5, the cell resistance, $R_{cell}$, of the auxiliary battery 14 is expected to increase as it ages. This information may be determined in any suitable fashion including testing, simulation, etc. The controller/charger 16 may store information related to such an expected aging curve and compare determined values of $R_{cell}$ against it to assess battery age/condition. For example, the controller/charger 16 may periodically (e.g., once each day) determine several $R_{cell}$ values using the algorithms described above. The controller/charger 16 may average these $R_{cell}$ values and place the average value along the aging curve according to the number of days that have passed since the battery was new (i.e., the first time the controller/charger 16 determined $R_{cell}$). As subsequent $R_{cell}$ values are determined, they may be stored and used to determine whether the auxiliary battery 14 is at its end of life as discussed below.

The rate of change of $R_{cell}$ over time (i.e., the slope of the curve illustrated in FIG. 5) becomes steeper as the auxiliary battery 14 approaches its end of life. A slope of at least a certain value may thus indicate that the auxiliary battery 14 is at its end of life. If the difference between a current value of $R_{cell}$ and a previously recorded value of $R_{cell}$ divided by the time passed between the two measurements is greater than a predetermined threshold (e.g., a slope that is 3 times greater than the slope around the new battery region), the controller/charger 16 may determine that the auxiliary battery 14 is at its end of life and needs to be replaced.

$R_{cell}$ values below the allowable variation region of the aging curve are indicative of a new battery. (The allowable variation region, for example, may represent ±5% of a mean value, and be determined via testing, simulation, etc.) In these circumstances, the controller/charger 16 may reinitialize/clear its record of any stored $R_{cell}$ values.

$R_{cell}$ values above the allowable variation region of the aging curve may be indicative of battery defects. In these circumstances, the controller/charger 16 may determine the likely cause of the battery defects and whether the auxiliary battery 14 is recoverable based on, for example, the values of the parameters from (7), (9) and (10).

The $C_{cell}$, Health_Term_1 and Health_Term_2 impedance parameters each have ranges of values that may be considered normal. That is, these parameters may be expected to take on values within these ranges under normal operating circumstances. Example normal ranges include, for $C_{cell}$, the new battery $C_{cell}$ value to 110% of that value, for Health_Term_1, 0.9 to 1.0, and for Health_Term_2, the new battery Health_Term_2 value to 60% of that value. Other ranges are also possible depending on the type of battery, etc.

Values less than the above ranges may be indicative of defect conditions (e.g., a shorted cell, battery dry out, a sulphated plate) as detailed in Table 1.

TABLE 1

|  | Shorted Cell | Dry Out | Sulphation |
|---|---|---|---|
| $C_{cell}$ | Normal | Low | Normal |
| Health_Term_1 | Low | Normal | Low |
| Health_Term_2 | Normal | Normal | Low |

The extent to which a parameter is "Low" may determine whether a defective battery is recoverable. As an example, if any of the parameters are 50% to 99% of their lower threshold normal values, the battery may be considered recoverable (through application of a proper charging profile as explained below). If any of the parameters are less than 50% of their lower threshold normal values, the battery may be considered unrecoverable. These recoverable/unrecoverable ranges depend on the type of battery and other design considerations. As a result, they may be determined based on testing, simulation, etc.

To extend the life of the auxiliary battery 14, the controller/charger 16 may tailor charging and/or operating profiles for the auxiliary battery 14 based on the above information. A charge profile may be defined by a charge voltage and maximum current. Absent any of the above battery diagnosis information (or under normal operating circumstances), the controller/charger 16 may select a default charge voltage and default maximum current at which to charge the auxiliary battery 14. These default values, however, may be altered based on battery age. For example, the default charge voltage may be increased based on the battery age. (Herein, age may be defined by the time that has passed, e.g., 389 days, from a "new battery" determination or age may be defined by the value of the slope of the aging curve, etc.) If, for example, the battery is 400 days old, the charge voltage may be increased by 10% relative to the default (or "new battery") charge voltage. Alternatively, if the current slope of the aging curve is 0.8, the charge voltage may be increased by 15% relative to the default charge voltage, etc. The optimum amount by which to alter the charge voltage may be determined via testing, simulation, etc.

The default charge parameters may also be altered based on whether the auxiliary battery 14 exhibits a defect as detailed in Table 2.

TABLE 2

|  | Shorted Cell | Dry Out | Sulphation |
|---|---|---|---|
| Charge Voltage | Decrease | Increase | Increase |
| Maximum Current | No Change | Decrease | No Change |

If, for example, the controller/charger 16 detects a shorted battery cell, the charge voltage may be decreased 10% relative to the "new battery" charge voltage. If, for example, the controller/charger 16 detects a dry out condition, the age adjusted charge voltage may be increased by 12% and the maximum current may be decreased by 18%. If, for example, the controller/charger 16 detects a plate sulphation condition, the age adjusted charge voltage may be increased by 10%. Again, the optimum amount by which to alter the charge voltage and/or maximum current may be determined via testing, simulation, etc.

An operating profile may be defined by a set point voltage and set point current. Absent any of the above battery diagnosis information (or under normal operating circumstances), the controller/charger 16 may select a default set point voltage and set point current at which to operate the battery 14. These default values, however, may be altered based on battery age. That is, the set points are a function of battery age. For example, the default set point voltage and default set point current may be increased based on the battery age. The optimum amount by which to alter the set points may be determined via testing, simulation, etc.

The default operating parameters may also be altered based on whether the auxiliary battery 14 exhibits a defect as detailed in Table 3.

TABLE 3

|  | Shorted Cell | Dry Out | Sulphation |
|---|---|---|---|
| Set Point Voltage | Decrease | Increase | Increase |
| Set Point Current | No Change | No Change | No Change |

If, for example, the controller/charger 16 detects a shorted cell, the set point voltage may be decreased by 6%. If, for example, the controller/charger 16 detects a dry out condition, the set point voltage may be increased by 5%. If, for example, the controller/charger 16 detects a plate sulphation condition, the set point voltage may be increased by 15%. Again, the optimum amount by which to alter the set points may be determined via testing, simulation, etc.

As apparent to those of ordinary skill, the algorithms disclosed herein may be deliverable to a processing device, which may include any existing electronic control unit or dedicated electronic control unit, in many forms including, but not limited to, information permanently stored on non-writable storage media such as ROM devices and information alterably stored on writeable storage media such as floppy disks, magnetic tapes, CDs, RAM devices, and other magnetic and optical media. The algorithms may also be implemented in a software executable object. Alternatively, the algorithms may be embodied in whole or in part using suitable hardware components, such as Application Specific Integrated Circuits (ASICs), state machines, controllers or other hardware components or devices, or a combination of hardware, software and firmware components.

While embodiments of the invention have been illustrated and described, it is not intended that these embodiments illustrate and describe all possible forms of the invention. The words used in the specification are words of description rather than limitation, and it is understood that various changes may be made without departing from the spirit and scope of the invention.

What is claimed:

1. A vehicle comprising:
a battery; and
at least one controller configured to
select a charge voltage and maximum current for the battery based on a rate of change of an impedance parameter of the battery indicative of battery age such that as the rate of change increases the selected charge voltage increases,
charge the battery at the selected charge voltage,
detect a sulphation condition of the battery based on a value of the impedance parameter falling within a predefined range of impedance parameter values, a value of a first health term of the battery, Health_Term_1, being less than a predefined range of first health term values, and a value of a second health term of the battery, Health_Term_2, being less than a predefined range of second health term values, and in response to the sulphation condition, increase the selected charge voltage.

2. The vehicle of claim 1, wherein the at least one controller is further configured to detect a shorted cell condition of the battery based on the value of the impedance parameter falling within the predefined range of impedance parameter values, the value of the first health term of the battery being less than the predefined range of first health term values, and the value of the second health term of the battery falling within the predefined range of second health term values, and in response to the shorted cell condition, decrease the selected charge voltage.

3. The vehicle of claim 1, wherein the at least one controller is further configured to detect a dry out condition of the battery based on the value of the impedance parameter being less than the predefined range of impedance parameter values, the value of the first health term of the battery falling within the predefined range of first health term values, and the value of a second health term of the battery falling within the predefined range of second health term values, and in response to the dry out condition, increase the selected charge voltage and decrease the maximum current.

4. A method for charging a battery comprising:
selecting a charge voltage and maximum current for the battery based on a rate of change of an impedance parameter of the battery indicative of battery age such that as the rate of change increases the selected charge voltage increases;
charging the battery at the selected charge voltage;
detecting a shorted cell condition of the battery based on a value of the impedance parameter falling within a predefined range of impedance parameter values a value of a first health term of the battery, Health_Term_1, being less than a predefined range of first health term values, and a value of a second health term of the battery, Health_Term_2, falling within a predefined range of second health term values; and
in response to the shorted cell condition, decreasing the selected charge voltage.

5. The method of claim 4, further comprising detecting a dry out condition of the battery based on the value of the impedance parameter being less than the predefined range of impedance parameter values, the value of the first health term of the battery falling within the predefined range of first health term values, and the value of the second health term of the battery falling within the predefined range of second health term values, and in response to the dry out condition, increasing the selected charge voltage and decreasing the maximum current.

6. The method of claim 4, further comprising detecting a sulphation condition of the battery based on the value of the impedance parameter falling within the predefined range of impedance parameter values, the value of the first health term of the battery being less than the predefined range of first health term values, and the value of a second health term of the battery being less than the predefined range of second health term values, and in response to the sulphation condition, increasing the selected charge voltage.

7. A vehicle comprising:
a battery; and
at least one controller configured to
select a set point voltage and set point current for the battery based on a rate of change of an impedance parameter of the battery indicative of battery age such that as the rate of change increases the set point voltage and set point current increases,
charge the battery at the set points,
detect a dry out condition of the battery based on a value of the impedance parameter being less than a predefined range of impedance parameter values, a value of a first health term of the battery, Health_Term_1, falling within a predefined range of first health term values, and a value of a second health term of the battery, Health_Term_2, falling within a predefined range of second health term values, and
in response to the dry out condition, increase the set point voltage.

8. The vehicle of claim 7, wherein the at least one controller is further configured to detect the shorted cell condition of the battery based on the value of the impedance parameter falling within the predefined range of impedance parameter values, the value of the first health term of the battery being less than the predefined range of first health term values, and the value of the second health term of the battery falling within the predefined range of second health term values, and in response to the shorted cell condition, decrease the set point voltage.

9. The vehicle of claim 7, wherein the at least one controller is further configured to detect a sulphation condition of the battery based on the value of the impedance parameter falling within theft predefined range of impedance parameter values, the value of the first health term of the battery being less than the predefined range of first health term values, and the value of the second health term of the battery being less than the predefined range of second health term values, and in response to the sulphation condition, increase the set point voltage.

* * * * *